US010017856B1

(12) United States Patent
Arnepalli et al.

(10) Patent No.: US 10,017,856 B1
(45) Date of Patent: Jul. 10, 2018

(54) FLOWABLE GAPFILL USING SOLVENTS

(71) Applicant: APPLIED MATERIALS, INC., Santa Clara, CA (US)

(72) Inventors: Ranga Rao Arnepalli, Krishna (IN); Darshan Thakare, Maharashtra (IN); Abhijit Basu Mallick, Fremont, CA (US); Pramit Manna, Milpitas, CA (US); Robert Jan Visser, Menlo Park, CA (US); Prerna Sonthalia Goradia, Mumbai (IN); Nilesh Chimanrao Bagul, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/489,242

(22) Filed: Apr. 17, 2017

(51) Int. Cl.

| | |
|---|---|
| *H01L 21/02* | (2006.01) |
| *C23C 16/448* | (2006.01) |
| *C23C 16/40* | (2006.01) |
| *C23C 16/34* | (2006.01) |

(52) U.S. Cl.
CPC ........ *C23C 16/4486* (2013.01); *C23C 16/345* (2013.01); *C23C 16/401* (2013.01); *C23C 16/403* (2013.01); *C23C 16/405* (2013.01); *H01L 21/0217* (2013.01); *H01L 21/02153* (2013.01); *H01L 21/02164* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02271* (2013.01)

(58) Field of Classification Search
CPC ......... H01L 21/02153; H01L 21/02178; H01L 21/02181; H01L 21/02183; H01L 21/02189; H01L 21/02271
See application file for complete search history.

(56) References Cited

U.S. PATENT DOCUMENTS

| | | | | |
|---|---|---|---|---|
| 7,074,690 | B1 | 7/2006 | Gauri et al. | |
| 7,524,735 | B1 * | 4/2009 | Gauri | C23C 16/045 438/436 |
| 7,582,555 | B1 | 9/2009 | Lang et al. | |
| 7,629,227 | B1 | 12/2009 | Wang et al. | |
| 7,867,923 | B2 | 1/2011 | Mallick et al. | |
| 7,915,139 | B1 | 3/2011 | Lang et al. | |
| 7,935,643 | B2 | 5/2011 | Liang et al. | |
| 2011/0015167 | A1 | 1/2011 | Miehe et al. | |

(Continued)

*Primary Examiner* — Mounir Amer
(74) *Attorney, Agent, or Firm* — Kilpatrick Townsend & Stockton LLP

(57) ABSTRACT

Systems and methods for forming films on the surface of a substrate are described. The systems possess aerosol generators which form droplets from a liquid solution made from a solvent and a deposition precursor. A carrier gas may be flowed through the liquid solution and push the droplets toward a substrate placed in a substrate processing region. The droplets pass into the substrate processing region and chemically react with the substrate to form films. The temperature of the substrate may be maintained below the boiling temperature of the solvent during film formation. The solvent imparts a flowability to the forming film and enable the depositing film to flow along the surface of a patterned substrate during formation prior to solidifying. The flowable film results in bottom-up gapfill inside narrow high-aspect ratio gaps in the patterned substrate.

10 Claims, 10 Drawing Sheets

(56) References Cited

U.S. PATENT DOCUMENTS

| | | |
|---|---|---|
| 2011/0034039 A1 | 2/2011 | Liang et al. |
| 2011/0111137 A1 | 5/2011 | Liang et al. |
| 2011/0217851 A1 | 9/2011 | Lian et al. |
| 2015/0118863 A1* | 4/2015 | Rathod ............ H01L 21/02164 438/778 |
| 2017/0140920 A1* | 5/2017 | Arnepalli ............ H01L 21/0262 |

* cited by examiner

101

110 — Deliver Patterned Substrate into a Substrate Processing Region

120 — Dissolve a Precursor in a Solvent to form a Precursor Solution

130 — Flow a Carrier Gas into an Aerosol Generator equipped with Piezoelectric transducer in contact with the Precursor Solution 140 — Produce Aerosol Droplets from the Precursor Solution and Flow the Aerosol Droplets into a Substrate Process Chamber having the Substrate Processing Region which houses the Patterned Substrate 150 — Adsorb Aerosol Droplets onto Patterned Substrate Outside Gap then Flow the Droplets inside to Fill The Gap 160 — Evaporate the Solvent from the Adsorbed Aerosol Droplets to Fill Gap with Dielectric 170 — Remove Substrate from Substrate Processing Region

FIG. 1

FLOWABLE GAPFILL USING SOLVENTS

FIELD

The embodiments described herein relate to filling gaps with flowable films.

BACKGROUND

The miniaturization of semiconductor circuit elements has reached a point where feature sizes of about 10 nm are fabricated on a commercial scale. As the dimensions continue to get smaller, new challenges arise for process steps like filling a gap between circuit elements with a dielectric material that avoids electrical cross-talk. As the width between the elements continues to shrink, the gap between them often gets taller and narrower, making the gap difficult to fill without the dielectric material getting stuck to create voids or weak seams. Conventional chemical vapor deposition (CVD) techniques often experience an overgrowth of material at the top of the gap before it has been completely filled. This can create a void or seam in the gap where the depositing dielectric material has been prematurely cut off by the overgrowth; a problem sometimes referred to as breadloafing.

One solution to the breadloafing problem has been to use liquid precursors for the dielectric starting materials that more easily flow into the gaps. A technique currently in commercial use for doing this is called spin-on-glass (SOG). More recently, techniques have been developed that impart flowable characteristics to dielectric materials deposited by CVD. These techniques can deposit flowable precursors to fill a tall, narrow gap with porous material while reducing an incidence of creating voids or weak seams. While the new flowable CVD techniques represent a significant breakthrough in filling tall, narrow (i.e., high-aspect ratio) gaps with porous materials (such as low-k dielectric materials), there is still a need to increase the density of the gapfill material.

SUMMARY

Systems and methods for forming films on the surface of a substrate are described. The systems possess aerosol generators which form droplets from a liquid solution made from a solvent and a deposition precursor. A carrier gas may be flowed through the liquid solution and push the droplets toward a substrate placed in a substrate processing region. An inline mechanical pump connected with the aerosol generator can also be used to push the droplets towards the substrate. The droplets pass into the substrate processing region and chemically react with the substrate to form films. The temperature of the substrate may be maintained below the boiling temperature of the solvent during film formation. The solvent imparts a flowability to the forming film and enable the depositing film to flow along the surface of a patterned substrate during formation prior to solidifying. The flowable film results in bottom-up gapfill inside narrow high-aspect ratio gaps in the patterned substrate.

Methods described herein include forming a dielectric on a patterned substrate. The methods may include placing the patterned substrate into a substrate processing region of a substrate processing chamber. The patterned substrate includes a high aspect ratio gap. The methods further include dissolving a precursor into a solvent to form a precursor solution within an aerosol generator. The methods further include flowing a carrier gas into the aerosol generator to produce aerosol droplets. The aerosol droplets include the solvent and the precursor. The methods further include flowing the aerosol droplets into the substrate processing region. The methods further include adsorbing the aerosol droplets onto the patterned substrate to form adsorbed droplets outside the high aspect ratio gap. The methods further include flowing the adsorbed droplets into the high aspect ratio gap. The methods further include evaporating the solvent. The methods further include filling the high aspect ratio gap with the dielectric. The dielectric is formed from the precursor by a chemical reaction.

A temperature of the patterned substrate may be below a boiling point of the solvent during flowing the adsorbed droplets into the high aspect ratio gap. The dielectric may be one of silicon oxide, aluminum oxide, silicon nitride, hafnium oxide, zirconium oxide, tantalum oxide, titanium oxide or titanium-doped silicon oxide. An aspect ratio of the high aspect ratio gap may be greater than 10:1 height:width measured near a center between a bottom of the high aspect ratio gap and a top of the high aspect ratio gap. A width of the high aspect ratio gap may be less than 10 nm. The dielectric may fill the high aspect ratio gap without voids.

Methods described herein include forming a dielectric layer on a patterned substrate. The methods include placing the patterned substrate into a substrate processing region of a substrate processing chamber. The patterned substrate includes a high aspect ratio trench. The methods further include forming a liquid solution by combining a deposition precursor and a solvent. The methods further include placing the liquid solution into an aerosol generator. The methods further include applying ultrasonic or higher frequencies to a piezoelectric transducer submerged in the liquid solution. The methods further include forming aerosol droplets in the aerosol generator from the liquid solution. The methods further include flowing the aerosol droplets into the substrate processing region. The methods further include forming an adsorbed liquid on the patterned substrate by depositing the aerosol droplets on the patterned substrate. The adsorbed liquid includes the deposition precursor and the solvent. The methods further include flowing the adsorbed liquid along a surface of the patterned substrate into the high aspect ratio trench. The methods further include filling the high aspect ratio trench with the adsorbed liquid beginning at a bottom of the high aspect ratio trench and finishing at an opening of the high aspect ratio trench. The methods further include evaporating the solvent. The methods further include forming the dielectric layer on the patterned substrate from the deposition precursor. The dielectric layer fills the high aspect ratio trench.

An aspect ratio of the high aspect ratio trench may be greater than 10:1 height:width measured near a center between the bottom of the high aspect ratio trench and the opening of the high aspect ratio trench. A width of the high aspect ratio trench may be less than 10 nm. The dielectric layer may fill the high aspect ratio trench without voids.

Substrate processing chambers described herein include a carrier gas supply. The substrate processing chambers include an aerosol generator configured to receive a carrier gas from the carrier gas supply. The aerosol generator includes a piezoelectric transducer configured to produce aerosol droplets from a liquid solution. The liquid solution is formed from a solvent and a precursor dissolved in the solvent. The substrate processing chambers further include a substrate processing region. The substrate processing chambers further include a precursor conduit configured to receive the aerosol droplets and pass the aerosol droplets into the substrate processing region. The substrate processing chambers further include a substrate pedestal disposed within the substrate processing region within the substrate processing chamber. The substrate pedestal is configured to support the substrate during formation of the film.

The precursor conduit may be configured to pass the aerosol droplets into the substrate processing region through a top of the substrate processing region. The piezoelectric transducer may be in direct contact with the liquid solution. The substrate processing chambers may further include a remote plasma system configured to receive a gas, to form remote plasma effluents, and to flow the remote plasma effluents into the substrate processing region. The substrate processing chambers may further include a local excitation source configured to receive and excite the aerosol droplets within the substrate processing region.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the disclosed embodiments may be realized by reference to the remaining portions of the specification and the drawings.

FIG. 1 is a flow chart of a film formation process according to embodiments.

Figure 2:
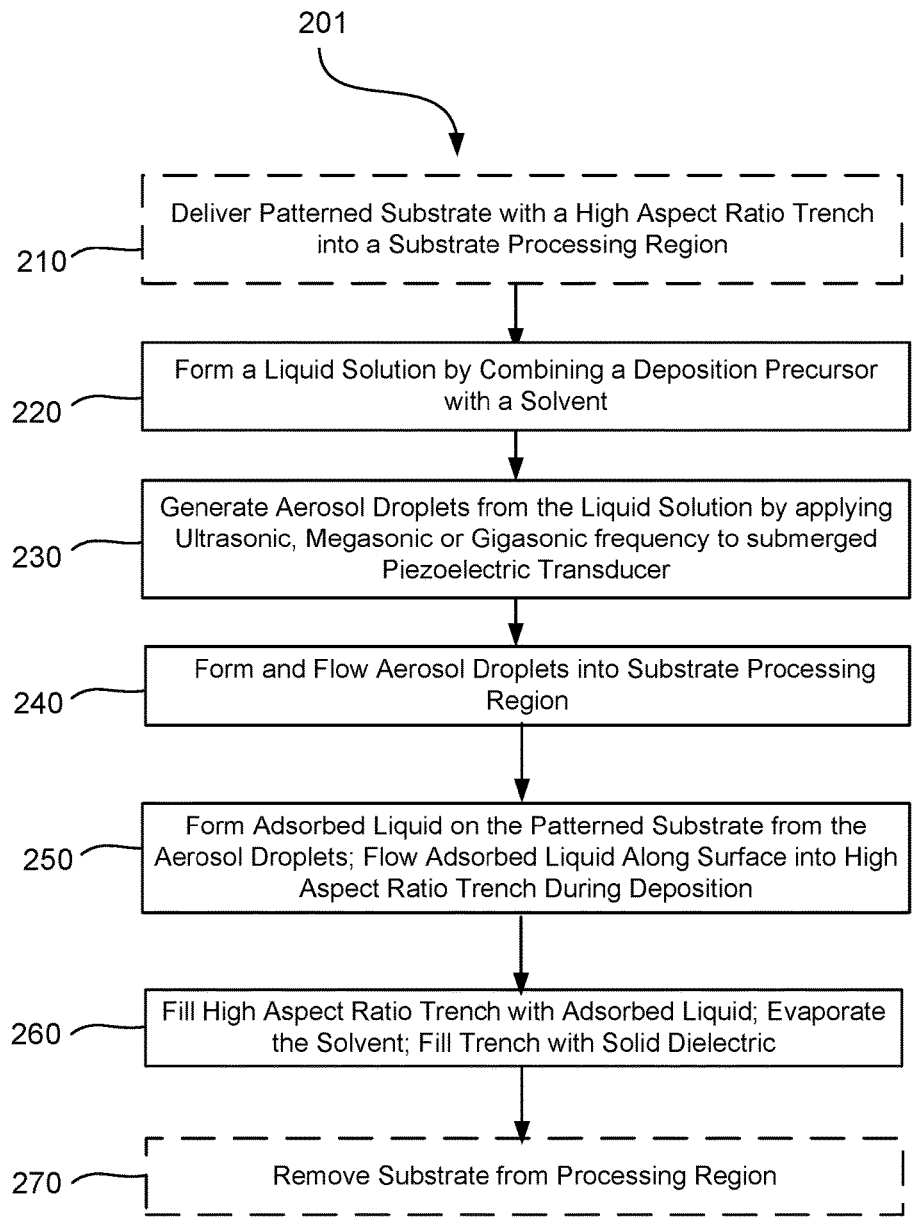
FIG. 2 is a flow chart of a film formation process according to embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Systems and methods for forming films on the surface of a substrate are described. The systems possess aerosol generators which form droplets from a liquid solution made from a solvent and a deposition precursor. A carrier gas may be flowed through the liquid solution and push the droplets toward a substrate placed in a substrate processing region. An inline mechanical pump connected with the aerosol generator can also be used to push the droplets towards the substrate. The droplets pass into the substrate processing region and chemically react with the substrate to form films. The temperature of the substrate may be maintained below the boiling temperature of the solvent during film formation. The solvent imparts a flowability to the forming film and enable the depositing film to flow along the surface of a patterned substrate during formation prior to solidifying. The flowable film results in bottom-up gapfill inside narrow high-aspect ratio gaps in the patterned substrate.

The size reduction of integrated circuit (IC) features has enabled increases in performance while reducing costs. Each size reduction (referred to as a node) involves overcoming a suite of technological hurdles. Exemplary hurdles involve crosstalk, line shorting, and mechanical failure after chemical mechanical polishing (CMP). To overcome these challenges, dielectric materials have been used for shallow trench isolation of IC chips. Gapfill low dielectric constant materials, for example, can isolate circuits disposed on either side of the gap. Circuit isolation may improve device performance. Filling high aspect ratio structures without voids or seams would improve device performance. Existing methods and systems are available to fill low-k materials like $SiO_2$, but there are no analogous techniques or methods available for high k materials deposition like TiOx, HfOx, SiN etc. The methods and systems described herein involve depositing a variety of materials onto a patterned substrate at low temperature while material flows after adsorption onto the patterned substrate before solidifying. The flowing of the material after adsorption enables a desirable bottom up gapfill without the formation of seams, voids and other defects inside the gap. The methods disclosed also improve the quality of materials (e.g. $SiO_2$) for which flowable deposition techniques already existed. However, the techniques described herein may also be used to flowably deposit materials which had no prior solution.

Dielectric material may be formed in gaps and trenches using the techniques presented herein. Dielectric material may be formed in high aspect ratio structures without voids or seams according to embodiments. The gapfill processes involve atomization of the source precursor in the solvent with an atomizer and the precursor mist is delivered into the chamber through without or with a carrier gas (an inert gas, e.g. $N_2$ or Ar). The precursor and the solvent may be in a gas-liquid combined phase in the form of droplets. The solvent is selected to have a low viscosity which enables the droplets to adsorb onto the surface of the patterned substrate and flow on the surface before forming the solid gapfill dielectric in a gap on the patterned substrate. The gapfill dielectric preferentially flows into gaps and fills the gap from the bottom first before filling progressively higher in the gap until the gap is filled all the way to the opening in embodiments. Conventional chemical vapor deposition (CVD) systems may expose the patterned substrate to precursors alone (without the solvent) which limits the flow of adsorbates across the surface of the patterned substrate. The techniques presented herein result in flowably deposited films at low substrate temperatures (e.g. room temperature up to the boiling point of the solvent). The techniques described herein can fill high aspect ratio gaps with dielectric material having a wide range of dielectric constants (low dielectric constant <3.5 through high dielectric constant >7). The techniques offer greater flexibility on the selection of the precursors since flowability is supplied by the solvent droplets rather than the precursor or a combination of precursors as with conventional flowable CVD. The precursor need not to be volatile and there are no constraints on the vapor pressure of the precursors. The precursor may be selected to be soluble in a selected solvent. The solvent may be an organic solvent according to embodiments. After the precursor is dissolved in the solvent the mist or aerosol is generated using an aerosol generator. The mist contains solvent along with the precursor and the mist is delivered into the CVD chamber to react with the patterned substrate supported on a pedestal. Following adsorption and redistribution (flow) on the surface of the patterned substrate, the solvent evaporates leaving behind the source precursor.

The embodiments described herein may involve a precursor in combination with a solvent to form a liquid solution. A liquid may be referred to as a condensed matter which consists of atoms/molecules which are constantly under the influence of the forces imparted by neighboring atoms/molecules and may be defined as matter having essentially no or no mean free path according to embodiments. An aerosol is formed from the condensed matter and may be formed using an atomizer (other terms include vaporizer, volatizer, nebulizer or humidifier) formed from a transducer. The atomizer may have a piezoelectric transducer that can be operated at one or more frequencies (e.g. ultrasonic, megasonic and gigasonic frequencies). The atomizer may generate aerosol droplets which are, optionally, carried into the reaction chamber (substrate processing region) using a carrier gas such as nitrogen ($N_2$) or argon (Ar). The carrier gas may be inert and not form covalent chemical bonds with the condensed matter nor with the substrate. An inline mechanical pump connected with the aerosol generator can also (alone or in combination with the carrier gas) be used to push the droplets towards the substrate.

The aerosol droplets may pass through conduit(s) which are heated to prevent condensation. The temperatures of all conduit(s) or other contact surfaces may be kept below the boiling point of the solvent in the aerosol droplets. The substrate processing region resides within a substrate processing chamber. The substrate processing region may be in a vacuum chamber which is evacuated of atmospheric gases prior to delivery of precursors. The substrate processing region is sealed from the external atmosphere and may be operated at much lower than atmospheric pressure to evacuate the atmospheric gases in embodiments. The precursor may be soluble in a solvent or mixture of solvents from which aerosol droplets are generated.

To better understand and appreciate the embodiments described herein, reference is now made to FIG. 1 and FIG. 2 which are flow charts of film formation processes (101 and 201) according to embodiments. Concurrent reference will be made to FIG. 5A which includes a schematic cross-sectional view of a substrate processing chamber 1001 according to embodiments. Any of the substrate processing chambers of FIG. 5A, FIG. 5B, FIG. 5C, FIG. 5D, FIG. 5E, FIG. 5F, or combinations of their elements, may be used to perform the processes described herein (e.g. 101 or 102). In process 101, the patterned substrate 1013 is (optionally) delivered into substrate processing region of substrate processing chamber 1001 in operation 110. The patterned substrate 1013 is supported by the substrate pedestal 1014 which may be resistively heated and/or cooled by passing a thermally controlled liquid through the substrate pedestal 1014. A portion of substrate pedestal and all of the patterned substrate 1013 are shown inside the substrate processing region. The substrate processing region is otherwise bounded by chamber body 1006.

A precursor is dissolved in a solvent in operation 120 and placed in an aerosol generator 1003-1 with a piezoelectric transducer 1004-1. A carrier gas is heated in heated carrier gas supply 1002 and flowed into aerosol generator 1003-1 in operation 130. Piezoelectric transducer 1004-1 is vibrated by applying an oscillating voltage to the top and bottom of the transducer and aerosol droplets are generated from the precursor solution in aerosol generator 1003-1 (operation 140). Also in operation 140, the aerosol droplets flow through the precursor conduit 1015-1 and enter substrate processing chamber 1001 through top lid 1005. The aerosol droplets are adsorbed onto the patterned substrate 1013 but remain in a liquid and flowable form facilitating the flow into a gap in the patterned substrate. Some aerosol droplets deposit initially outside the gap and flow on the surface into the gap to fill the gap (operation 150). The solvent is removed (desorbed) from the liquid in operation 160. Operation 160 takes place predominantly after the beneficial flow into the gap has occurred. The substrate is optionally removed from the substrate processing region in operation 170.

Aerosol generators 1003 may be positioned close to substrate processing chamber 1001 to maintain small aerosol droplet sizes. The volume within Aerosol generators 1003 may be roughly proportional to the area of the substrate to be processed. For example, a one liter aerosol generator 1003 may be used to create aerosol droplets for a 300 mm substrate. A mass flow controller may be used to control flow rate of aerosol droplets within the precursor conduit 1015-1 towards substrate processing chamber 1001. The precursor conduit 1015-1 may contain heated activated charcoal to maintain elevated temperature (above room temperature) of the aerosol droplets which also helps to maintain small aerosol droplet sizes.

Reference is now made to FIG. 2. A patterned substrate is placed within a substrate processing region in optional operation 210. A liquid solution is placed in an aerosol generator 1003-2 having an embedded transducer 1004-2. The liquid solution is formed by combining a deposition precursor with a solvent. A carrier gas is heated in heated carrier gas supply 1002 and flowed into aerosol generator 1003-2. Transducer 1004-2 is vibrated by applying an oscillating voltage to the top and bottom of the transducer and aerosol droplets are generated from the liquid solution in aerosol generator 1003-2 (operation 220). The aerosol droplets then flow through the precursor conduit 1015-2 and enter substrate processing chamber 1001 through top lid 1005 in operation 240. A thin film is deposited on the patterned substrate 1013 from the small aerosol droplets in operations 250-260. The combination of the precursor and the solvent may be referred to as an adsorbed liquid once the droplets land on the substrate. The adsorbed liquid comprises the precursor and the solvent and flows on the surface during deposition. The adsorbed liquid may initially deposit (operation 250) inside or outside the high aspect ratio trench and flow along the surface of the patterned substrate to fill the high aspect ratio trench in a bottom-up fashion (operation 260). The solvent is then evaporated to fill the trench with solid dielectric (also operation 260). The patterned substrate 1013 may then be removed from the substrate processing region in optional operation 270.

In all embodiments described herein, the precursor and the solvent are in a liquid solution. The vapor pressure of the liquid solution may be greater than 1 mTorr, greater than 10 mTorr, greater than 0.1 Torr, greater than 1 Torr, greater than 10 Torr, greater than 30 Torr or greater than 50 Torr, according to embodiments. The pressure in the substrate processing region may be greater than 10 Torr, greater than 30 Torr, greater than 50 Torr, or greater than 100 Torr. The pressure in the substrate processing may be increased by using the optional carrier gas to assist in the delivery of the aerosol droplets from the liquid solution into the substrate processing region. Higher pressure during deposition has been correlated with improved gapfill.

Deep gaps, trenches or vias often exhibit a higher deposition rate near their opening relative to portions deep within a trench especially when droplet sizes are large compared to the feature sizes or linewidths. The methods described herein may be used to fill gaps or trenches having a width (in the narrower dimension) less than having a width less than 10 nm, less than 8 nm or less than 7 nm, according to embodiments, as measured halfway between the bottom and the top (opening) of the gap. The depths of a via or trench may be greater than 70 nm, greater than 80 nm or greater than 100 nm in embodiments. Depths are measured herein from the top (the opening) to the bottom of a trench. The aspect ratio (height:width) may be greater than 7:1, greater than 10:1, greater than 15:1 or greater than 20:1 according to embodiments. "Top", "above" and "up" will be used herein to describe portions/directions perpendicularly distal from the substrate plane and further away from the major plane of the substrate in the perpendicular direction. "Vertical" will be used to describe items aligned in the "up" direction towards the "top". Other similar terms may be used whose meanings will now be clear.

Figure 3A:
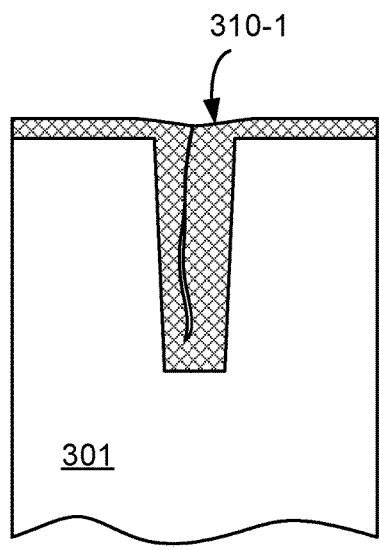
FIG. 3A is a side view of a patterned substrate following gapfill dielectric deposition in the absence of aerosol solvents.
Figure 3B:
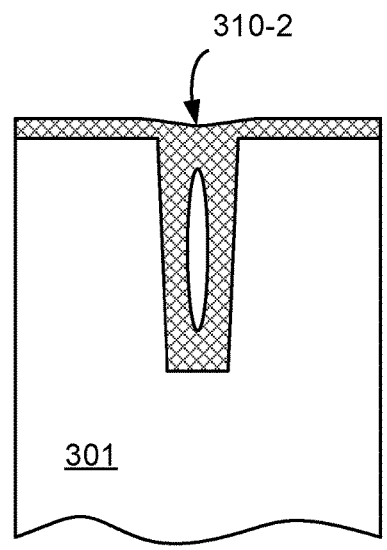
FIG. 3B is a side view of a patterned substrate following gapfill dielectric deposition in the absence of aerosol solvents.
Figure 3C:
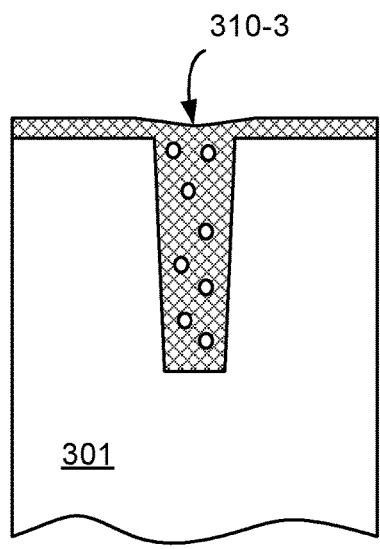
FIG. 3C is a side view of a patterned substrate following gapfill dielectric deposition in the absence of aerosol solvents.

FIGS. 3A, 3B and 3C are side views of a patterned substrate following gapfill dielectric deposition into gaps or trenches as described herein but without the use of aerosol solvents. FIG. 3A shows a patterned substrate 301 with dimensions described herein but revealing a seam defect which arises when flow is limited on the surface during deposition. Gapfill dielectric 310-1 predominantly grows horizontally outward from the sides and chokes off penetration of further gapfill dielectric, leaving a vertical seam near the center of the gap. FIG. 3B shows the patterned substrate 301 and a gapfill dielectric 310-2 with excessive deposition near the opening of the gap or trench. The void in the center of the trench arises once the opening closes to halt further penetration of dielectric material into the gap. FIG. 3C shows the patterned substrate 301 and a porous gapfill dielectric 310-3 the gap or trench. The pores, voids and seams present in each of the figures may compromise the performance of integrated circuits formed with gapfill dielectric. A benefit of the processes described herein include a reduction in concentration or elimination of pores, voids and seams in gapfill dielectric according to embodiments. The processes described herein may also reduce shrinkage of gapfill dielectric during subsequent processing and may increase yield rates in embodiments. The gapfill dielectric may shrink less than 10%, less than 5% or less than 3% during subsequent processing following the removal of the patterned substrate from the substrate processing region in embodiments.

Figure 4A:
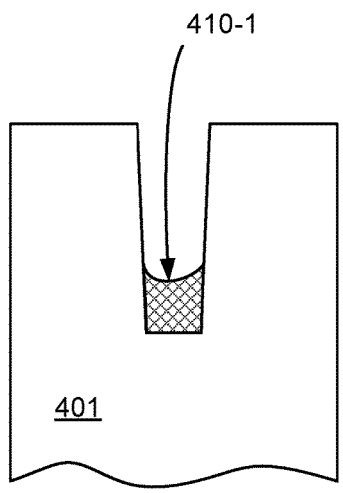
FIG. 4A is a side view of a patterned substrate following gapfill dielectric deposition using aerosol solvents according to embodiments.
Figure 4B:
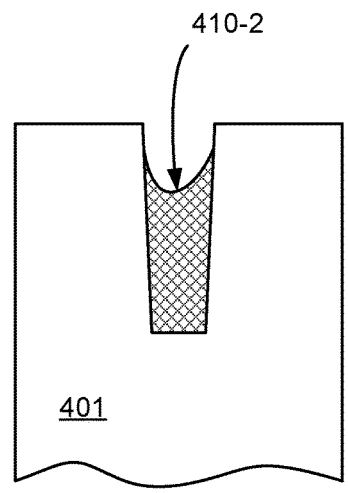
FIG. 4B is a side view of a patterned substrate following gapfill dielectric deposition using aerosol solvents according to embodiments.
Figure 4C:
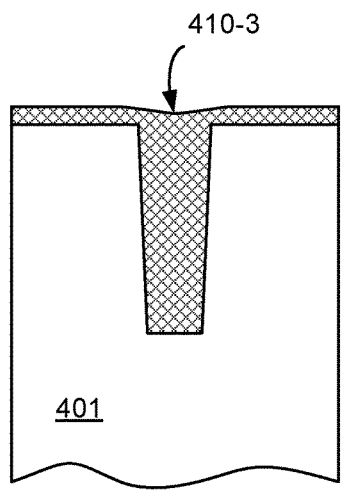
FIG. 4C is a side view of a patterned substrate following gapfill dielectric deposition using aerosol solvents according to embodiments.

FIGS. 4A, 4B and 4C are side views of a patterned substrate following gapfill dielectric deposition using aerosol solvents according to embodiments. FIG. 4A shows a patterned substrate 401 with gapfill dielectric beginning to fill a gap or trench by flowing preferentially to the bottom of the gap or trench during deposition. Gapfill dielectric 410-1 grows predominantly "bottom-up" from the bottom of the gap or trench towards the opening or top of the gap or trench. FIG. 4B shows the patterned substrate 401 following additional deposition of gapfill dielectric 410-2. Gapfill dielectric 410-2 continues growing towards the opening of the gap or trench. Gapfill dielectric 410-2 grows vertically in contrast to gapfill dielectric 310-1 and 310-2 which grew horizontally to form seams or voids. FIG. 4C shows the patterned substrate 401 and the gapfill dielectric 310-3 completely filling the gap or trench. No seams, voids or pores are present in the gap or trench according to embodiments.

The gapfill dielectric may be one of silicon oxide (e.g. $SiO_x$), titanium oxide ($TiO_x$), Ti doped SiOx, tantalum oxide ($TaO_x$), hafnium oxide (e.g. $HfO_x$), zirconium oxide (e.g. $ZrO_x$), aluminum oxide (e.g. $Al_2O_3$) or silicon nitride (SiN) in embodiments.

The solvent may be an organic solvent and may be one of ethanol, methanol isopropanol, butanol or pentanol according to embodiments. The solvent may also be a higher-order solvent which has six or more carbon atoms. The solvent may be a combination of ethanol and methanol (e.g. 50:50 ethanol/methanol, 75:25 ethanol/methanol or 90:10 ethanol methanol) in embodiments. The solvent may be one of xylene, benzene, toluene, hexane, cyclohexane, tetrahydrofuran, dimethyl sulfoxide, dimethylformamide, acetonitrile, dichloromethane, ethyl acetate, dimethyl sulfoxide, or chloroform according to embodiments. The solvent may comprise an aromatic hydrocarbon, may comprise or consist of carbon and hydrogen, or may comprise or consist of carbon, hydrogen and oxygen in embodiments.

Exemplary precursors include tetraethylorthosilicate and titanium isopropoxide, according to embodiments, used to form silicon nitride and titanium oxide. Examplary precursors further include organometallic precursors in embodiments. The precursors combined with the solvent to form the liquid solution may consist of a single metal element in covalent combination with a hydrocarbon ligand (e.g. methyl, ethyl ispropyl or a higher order hydrocarbon ligand) according to embodiments. A metal element is defined as an element which forms a metal if condensed matter consists only of the metal element. Precursors combined with the solvent may comprise or consist of a metal element and carbonyl, 3-aminopropyl in embodiments. Precursors may comprise or consist of a metal element and a hydrocarbon having a ring structure according to embodiments. For example, precursors may comprise or consist of a metal element and one of cyclopentadienyl, methylcyclopentadienyl, pentamethylcyclopentadienyl, ethylcyclopentadienyl, isopropylcyclopentadienyl, tri-isopropyl-cyclopentadienyl, tris(tert-butyl)cyclopentadienyl, n-propyltetramethyl-cyclopentadienyl, or trimethylsilyl-cyclopentadienyl in embodiments. Precursors may comprise or consist of a metal element and an oxygen atom bonding to a hydrocarbon ligand according to embodiments. For example, precursors may comprise or consist of a metal element and one of methoxy, ethoxy, n-propoxy, isopropoxy, n-butoxy, isobutoxy, tert-butoxy, or tertpentoxy in embodiments. The metal atoms may be one of zirconium, hafnium, titanium, aluminum, or cobalt according to embodiments. All ligands just described may be covalently combined with silicon, in embodiments, which is generally considered a semiconductor rather than a metal. Precursors may comprise or consist of a semiconducting element (e.g. silicon or germanium) and any of the ligands described herein in combination with the metal elements. All precursors described herein may be partially or fully substituted with halogens in place of hydrogens in embodiments. For example, hydrocarbon ligands may have some or all hydrogens replaced by fluorine, chlorine or bromine according to embodiments.

Figure 5A:
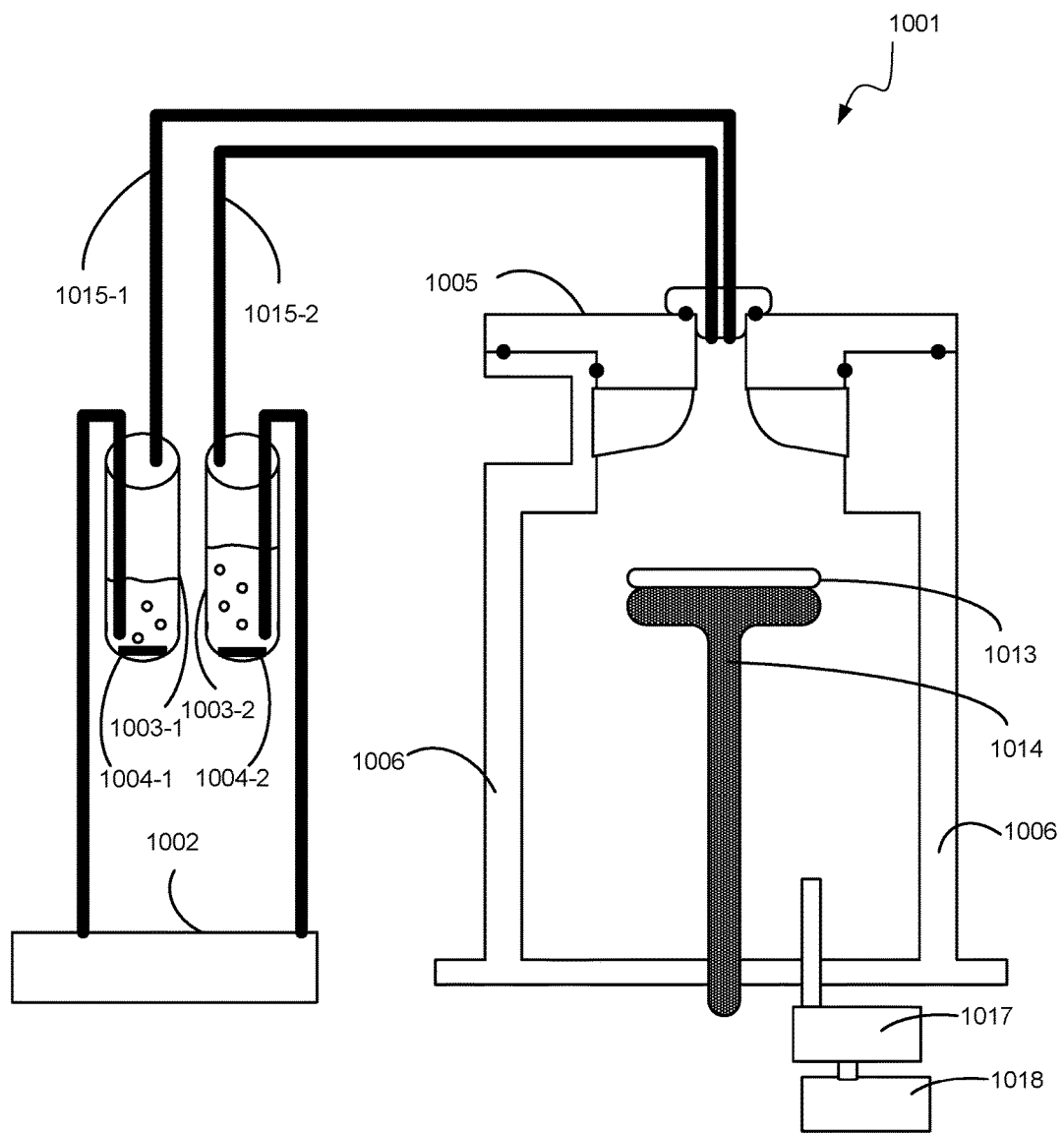
FIG. 5A shows a schematic cross-sectional view of a substrate processing chamber according to embodiments.

FIG. 5A shows a schematic cross-sectional view of a substrate processing chamber, according to embodiments, which may be used to perform the methods described herein. The equipment and techniques described herein may be useful for forming a variety of dielectric layers (insulators). The substrate temperature may be elevated above room temperature during deposition depending on the type of film grown and the precursor and solvent used. The aerosol processes introduced herein enable the processes to be performed at higher temperatures than prior art liquid processes in embodiments. The small aerosol droplets may pass through top lid 2005, then approach and contact the patterned substrate 1013 while the patterned substrate 1013 is maintained at a temperature between 0° C. and 300° C., between 25° C. and 260° C., between 50° C. and 230° C., or between 80° C. and 180° C. These substrate temperatures correspond to all deposition operations described herein. Chamber body 1006, top lid 1005 and any other components may be sealed with O-rings which are compatible with the particular process environment to ensure gas isolation between the substrate processing region and the atmosphere outside substrate processing chamber 1001.

The pressure in the substrate processing region during the deposition processes described herein may be greater than 10 Torr, greater than 30 Torr or greater than 100 Torr in embodiments. The reactions may proceed thermally, excited only by the temperature of the patterned substrate itself, according to embodiments. In embodiments which rely on the temperature of the substrate to effect the deposition reaction, the term "plasma-free" may be used herein to describe the substrate processing region during application using no or essentially no plasma power. Lack of plasma in the substrate processing region will be quantified in several complementary ways which may be used separately or in combination. The plasma power may also be kept below small threshold amounts to enable the appropriate reactions to proceed. The plasma power applied to the substrate processing region may be less than 100 watts, less than 50 watts, less than 30 watts, less than 10 watts and may be 0 watts in embodiments.

Absence (or reduction in magnitude) of any local plasma is desirable to make deposition processes more conformal and less likely to deform features. The term "plasma-free" will be used herein to describe the substrate processing region during application of no or essentially no plasma power to the substrate processing region. Stated another way, the electron temperature in the substrate processing region may be less than 0.5 eV, less than 0.45 eV, less than 0.4 eV, or less than 0.35 eV according to embodiments. The low vapor pressure precursor is not excited in any remote plasma prior to entering the substrate processing region in embodiments. For example, if a remote plasma region or a separate chamber region is present and used to conduct the aerosol droplets toward the substrate processing region and any remote region(s) may be plasma-free as defined herein.

Additional benefits of the hardware and processes described herein can now be described. Prior art aerosol droplets have had diameters between about 0.5 µm and several µms. Several problems arise from having large diameter droplets delivering the precursors to the patterned substrate. The aerosol droplets formed herein may have a diameter between 3 nm and 75 nm, between 5 nm and 50 nm or between 10 nm and 25 nm according to embodiments. Small aerosol droplet dimensions facilitate penetration of the precursor sources into smaller features on a patterned substrate. The smaller sizes may result in enhanced material gapfill and fewer trapped voids within gaps. Some elements are not desirable in the deposited film. The smaller droplet sizes described herein enable undesirable elements (e.g. carbon or hydrogen) to form volatile species which readily leave the surface during the deposition reaction. Small aerosol droplets may be formed using ultrasonic agitation in aerosol generators 1003. The small aerosol droplets flow through the precursor conduits 1015 and then into the substrate processing region. Sizes of the aerosol droplets may be measured using an in-situ particle size analyzers (such as a condensation particle counter or detector).

The substrate processing region within substrate processing chamber 1001 may be evacuated using the vacuum pump 1017 prior to introducing aerosol droplets into the substrate processing region during all deposition operations described herein. Some chemicals may require further processing after passing through the vacuum pump 1017 prior to being released into the atmosphere. A scrubber 1018 may be placed downstream from the vacuum pump 1017 to modify or remove chemical constituents of the process effluents before releasing the process effluents. A closed-loop exhaust feedback system may be used to maintain a desired pressure within the substrate processing region. In the event a pressure within the substrate processing region rises above a set point pressure (an overpressure situation), an automatic valve (not shown) may release the pressure inside substrate processing chamber 1001 opening the substrate processing region to the vacuum pump 1017 and the scrubber 1018.

FIG. 5A shows two aerosol generators (1003-1 and 1003-2) for delivering low vapor pressure precursors into the substrate processing region. More than two aerosol generators may be present and they may be augmented by non-aerosol generating sources which are not shown in the drawing simply to increase readability. The transducers in one or more of the aerosol generators may alternatively be left off to provide a non-aerosol generating source with the hardware shown.

Figure 5B:
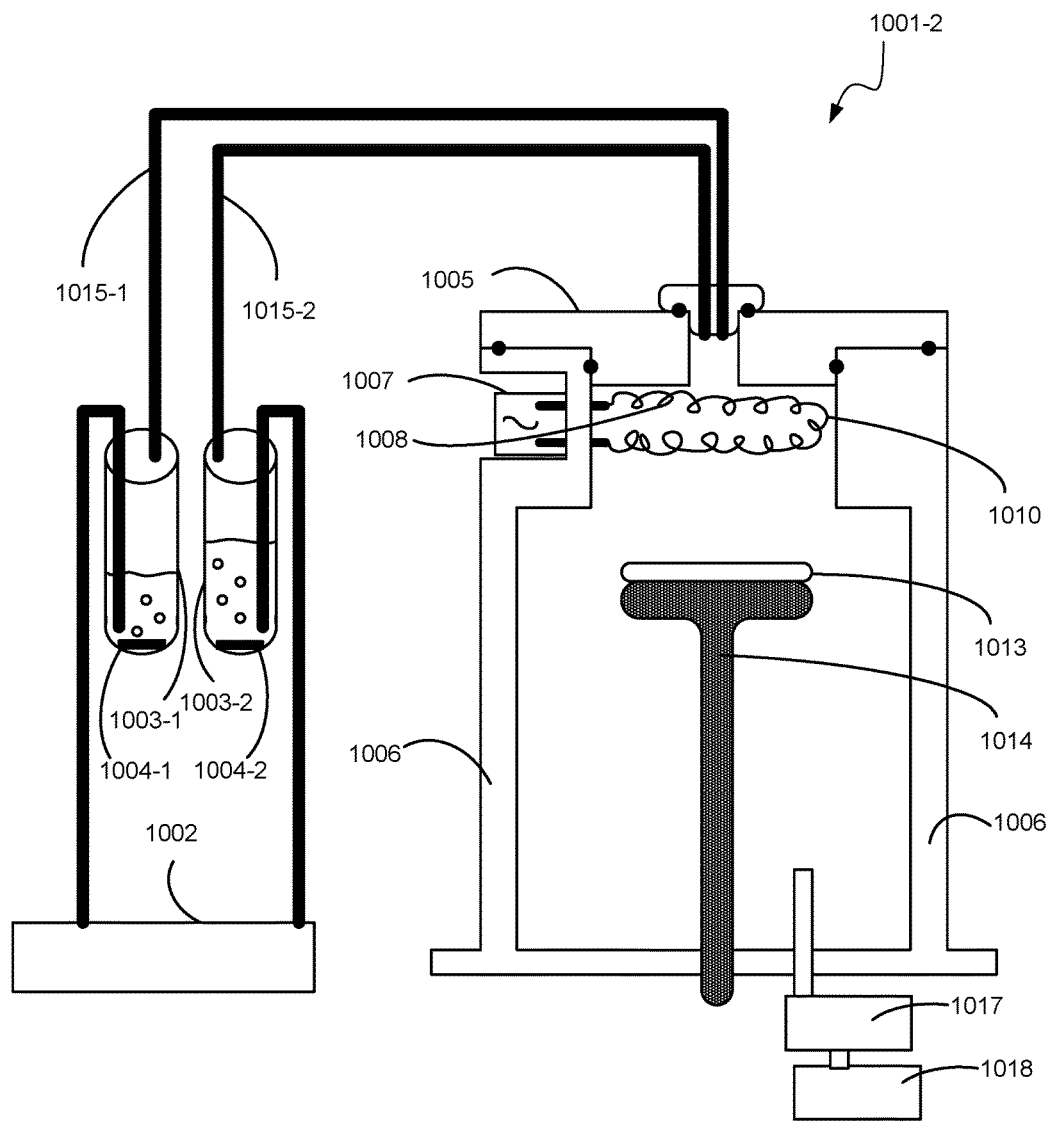
FIG. 5B shows a schematic cross-sectional view of a substrate processing chamber according to embodiments.

Several additional examples will be presented which show additional elements and configurations which may be added to any other embodiments discussed herein. FIG. 5B shows a schematic cross-sectional view of a substrate processing chamber, which may be used to perform the methods described herein in embodiments. The substrate processing chamber 1001-2 provides for a local excitation of the small aerosol droplets after the aerosol droplets enter the substrate processing region. The small aerosol droplets may pass through top lid 2005. Hot filament power may be applied to the hot filament 1008 from the hot filament power supply 1007. The hot filament 1008 may be configured along with the hot filament power supply to maintain a temperature of the hot filament 1008 above 2,000° C., above 2,100° C., or above 2,200° C. according to embodiments. The small aerosol droplets are excited by the hot filament 1008 and then contact the patterned substrate 1013 while the patterned substrate 1013 is maintained at substrate temperatures provided previously. Benefits and process parameters described before also apply to the equipment of FIG. 5B.

Figure 5C:
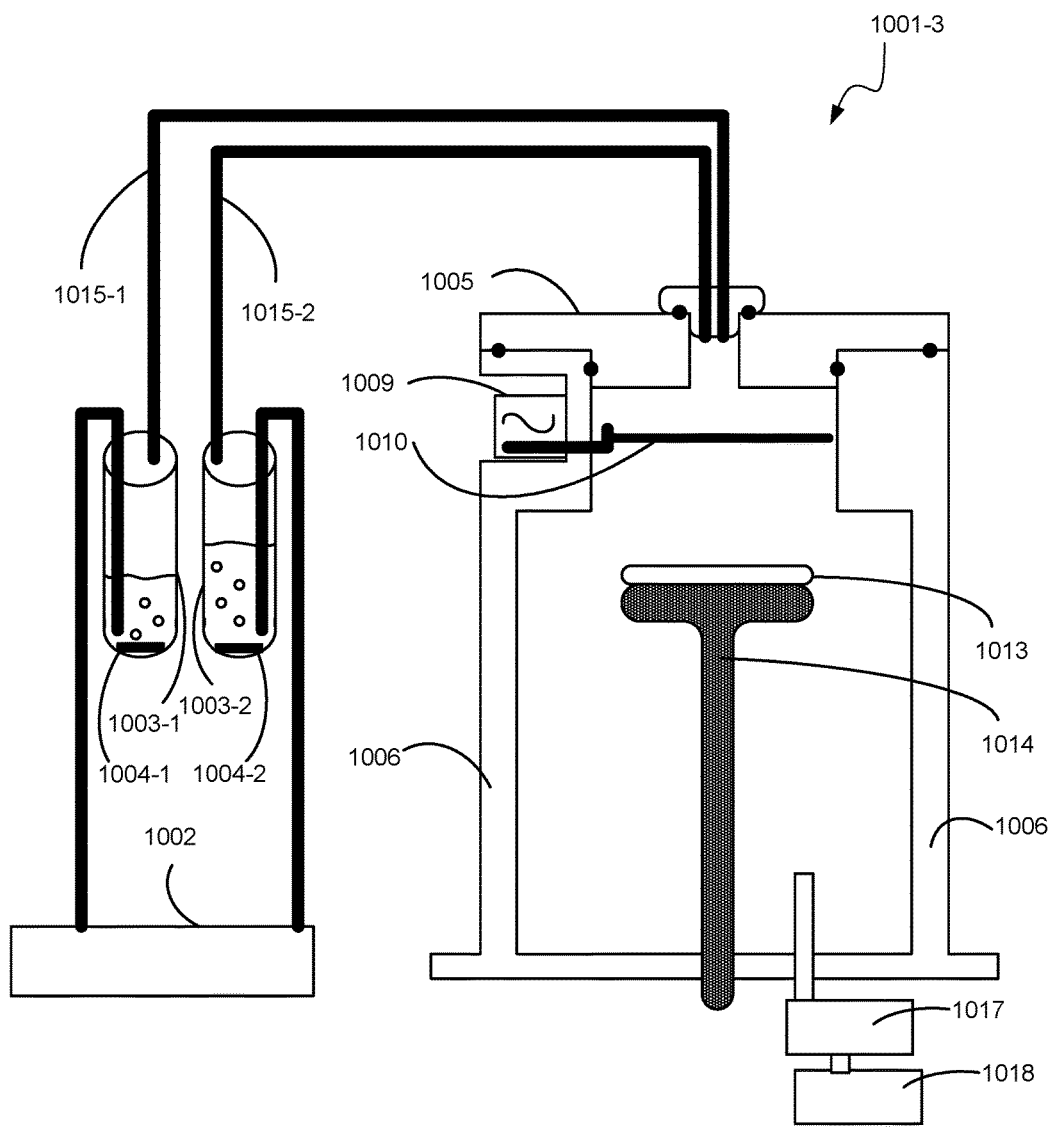
FIG. 5C shows a schematic cross-sectional view of a substrate processing chamber according to embodiments.
Figure 5D:
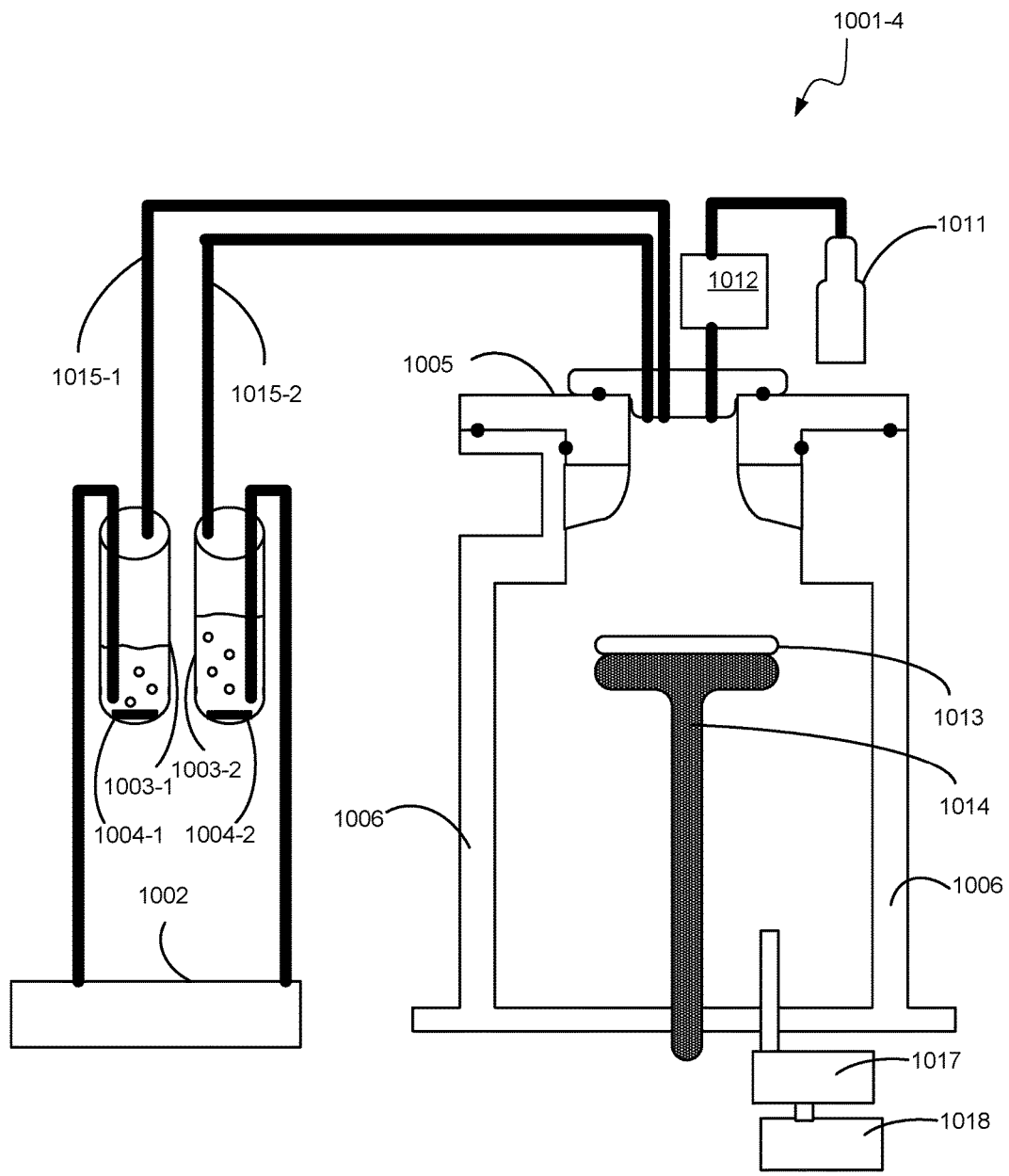
FIG. 5D shows a schematic cross-sectional view of a substrate processing chamber according to embodiments.
Figure 5E:
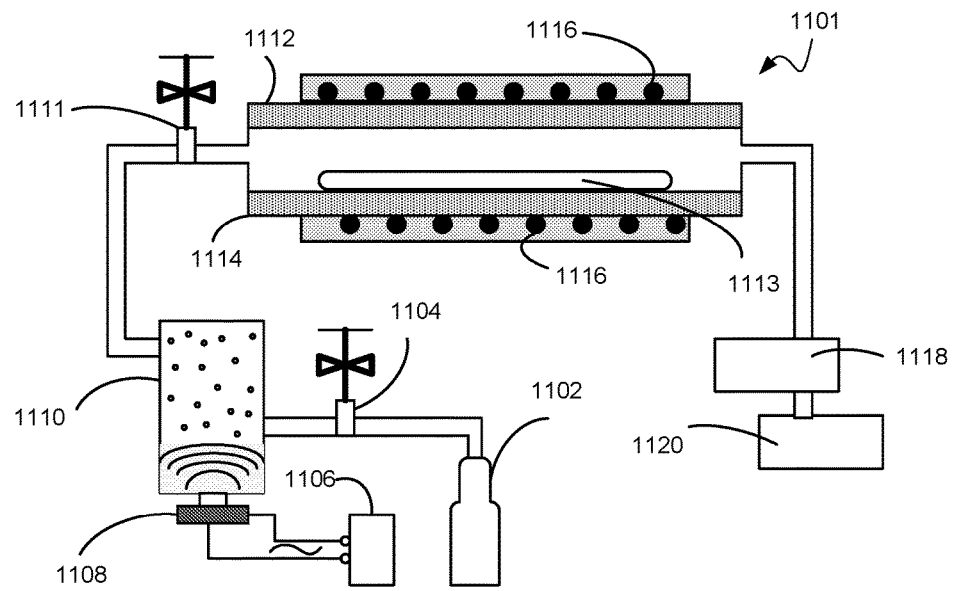
FIG. 5E shows a schematic cross-sectional view of a substrate processing chamber according to embodiments.
Figure 5F:
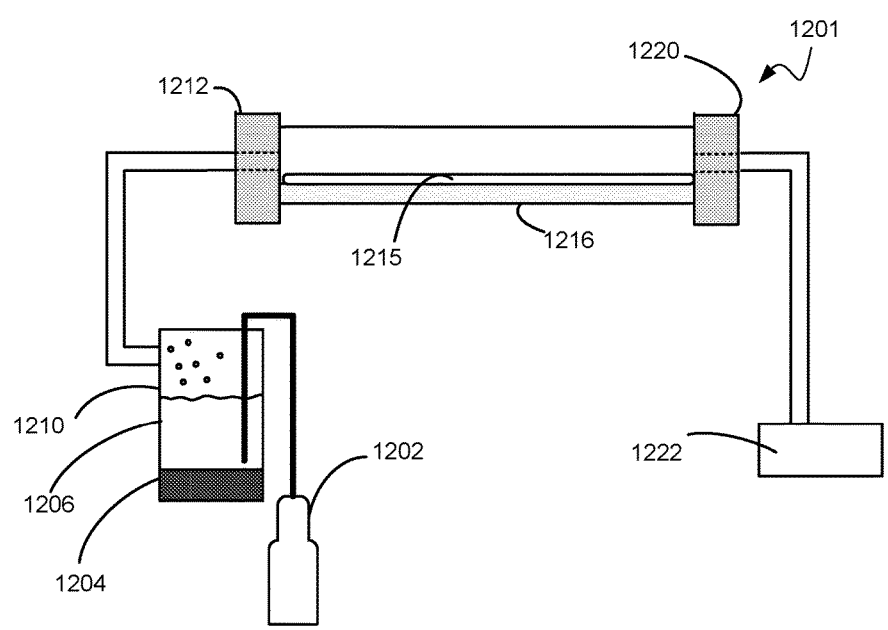
FIG. 5F shows a schematic cross-sectional view of a substrate processing chamber according to embodiments.

FIG. 5C shows a schematic cross-sectional view of a substrate processing chamber, which may be used to perform the methods described herein in embodiments. The substrate processing chamber 1001-3 provides for another form of local excitation of the small aerosol droplets after the aerosol droplets enter the substrate processing region. The small aerosol droplets may pass through the top lid 2005. Microwave power may be applied to the microwave antenna 1010 from the microwave power supply 1009. A local plasma may be formed in the substrate processing region by application of the microwave power to the microwave antenna 1010. Local plasma parameters will be provided herein. The small aerosol droplets are excited in the local plasma formed by application of the microwave power. Plasma effluents formed in the local plasma contact the patterned substrate 1013 while the patterned substrate 1013 is maintained at substrate temperatures provided previously. Benefits and process parameters described before also apply to the equipment of FIG. 5C and FIG. 5D below.

FIG. 5D shows a schematic cross-sectional view of a substrate processing chamber, which may be used to perform the methods described herein in embodiments. The substrate processing chamber 1001-4 provides for a remote excitation of a secondary gas to form remote plasma effluents in a remote plasma system 1012. The secondary gas may comprise one or more of oxygen ($O_2$), nitrogen ($N_2$), and argon according to embodiments. The secondary gas may comprise or consist only of inert gases in embodiments. The secondary gas flows from the plasma precursor supply 1011 into the remote plasma system 1012 where the remote plasma effluents are formed. Meanwhile, the small aerosol droplets enter the substrate processing region without being excited in the remote plasma system 1012. The small aerosol droplets may not be excited in any plasma prior to entering the substrate processing region according to embodiments. The small aerosol droplets may pass through top lid 2005. The substrate processing region may be devoid of plasma (as shown) or a local excitation (see FIGS. 5B and 5C) may be included to excite the combination of the small aerosol droplets and the remote plasma effluents in embodiments. If the remote plasma region is plasma-free, then the small aerosol droplets may be excited predominantly or only by the remote plasma effluents in embodiments. Substrate temperatures were provided previously.

Remote and plasma powers can be of a variety of frequencies or a combination of multiple frequencies. The remote plasma may be provided by RF power delivered to the remote plasma system 1012 by capacitive or inductive means. The RF power may alternatively or in combination be applied within the substrate processing region to form a local plasma. The RF power applied to the remote plasma system may be between 100 watts and 10,000 watts, between 200 watts and 15,000 watts, preferably between 500 watts and 10,000 watts or more preferably between 2,000 watts and 7,500 watts in embodiments. The RF power applied to the substrate processing region to form the local plasma may be between 10 watts and 10,000 watts, between 10 watts and 5,000 watts, preferably between 25 watts and 2000 watts or more preferably between 50 watts and 1500 watts in embodiments. The RF frequency applied to form either the local plasma or the remote plasma may be low RF frequencies less than 200 kHz, higher RF frequencies between 10 MHz and 15 MHz, or microwave frequencies greater than or about 1 GHz in embodiments. The remote plasma and the local plasma may be used separately or in combination. The local plasma may be used to excite the aerosol droplets and any secondary gas in embodiments. The remote plasma may excite only the secondary gas but not the aerosol droplets according to embodiments.

FIG. 5E shows a schematic cross-sectional view of another substrate processing chamber 1101, according to embodiments, which may also be used to perform the methods described earlier. Features and elements of each embodiment may be added to some or all features and elements of another embodiment to arrive at further embodiments. The patterned substrate 1113 is placed into the substrate processing region of substrate processing chamber 1101 for deposition. The patterned substrate 1113 is supported on the susceptor 1114. A carrier gas is flowed from the carrier gas supply 1102 through the carrier gas supply valve 1104 and into the aerosol generator 1110. The RF power supply 1106 is configured to supply an alternating electrical signal (e.g. ultrasonic or greater frequency) to the piezoelectric transducer 1108 disposed in physical contact with the aerosol generator 1110. The piezoelectric transducer 1108 vaporizes a precursor-solvent combination and the optional carrier gas originating from the carrier gas supply 1102 flows through the aerosol generator 1110 and carries vaporized precursor through the chamber entry valve 1111 into the substrate processing region of the substrate processing chamber 1101. The carrier gas may be heated prior to passing through the carrier gas supply valve 1104 and entering the aerosol generator 1110 as before.

The susceptor 1114 is parallel to the top plate 1112 and the vaporized precursor or aerosol droplets are delivered into the substrate processing region from between the susceptor 114 and the top plate 1112. FIGS. 5A-5D showed aerosol droplets delivered through one of the top plate and FIG. 5E shows a configuration in which flowing through a top plate is not necessary. The top plate 1112 and the susceptor 1114 are planar, in embodiments, and each are parallel to the major plane of the patterned substrate 1113. A dielectric film is deposited on patterned substrate 1113 from the aerosol droplets. Unreacted precursor or other process effluents may be pumped out using vacuum pump 1118 and a scrubber 1120 may be used to chemically alter the process effluents to increase environmental compatibility.

A heater coil 1116 may be disposed on the top plate 1112 and/or on the susceptor 1114. Heating the top plate 1112 and/or the susceptor 1114 discourages condensation of the vaporized precursor and decreases aerosol droplet size. The substrate temperature may be elevated above room temperature during deposition depending on the type of film grown and precursors and solvents used. The dry or liquid-gaseous processes introduced herein enable the processes to be performed at higher temperatures than prior art wholly liquid processes. The vaporized precursor makes contact with patterned substrate 1113 while the patterned substrate is maintained at a temperature between 0° C. and 300° C. according to embodiments. Process pressures were also given previously and will not be repeated here for the sake of brevity. The reactions may proceed thermally, excited only by the temperature of the patterned substrate itself, according to embodiments. The substrate processing region may be described as plasma-free whose definition was previously presented.

FIG. 5F shows a schematic cross-sectional view of another substrate processing chamber 1201, according to embodiments, which may also be used to perform the methods described earlier. Features and elements of each embodiment may be added to some or all features and elements of another embodiment to arrive at further embodiments. The patterned substrate 1215 is placed into the substrate processing region of substrate processing chamber 1201 prior to deposition. The patterned substrate 1215 is supported on the substrate pedestal 1216. The substrate pedestal 1216 may be a vacuum compatible material which is an electrical insulator in embodiments. The substrate pedestal 1216 may further be configured to be vacuum compatible at the substrate temperatures described herein. The substrate pedestal 1216 may be a carbon block, in embodiments, and may comprise or consist of carbon. A carrier gas is flowed from the carrier gas supply 1202 into the aerosol generator 1210 and bubbled through a liquid solution 1206 formed from a solvent and a precursor. An RF power supply (not shown) is configured to supply an alternating electrical signal (e.g. ultrasonic) to piezoelectric transducer 1204 disposed inside aerosol generator 1210. The piezoelectric transducer 1204 may be vibrated to beneficially promote the carrying of aerosol droplets of liquid solution 1206 material toward the substrate processing region of substrate processing chamber 1201.

The entry plate 1212 is parallel to the exit plate 1220 and the vaporized precursor or aerosol droplets are delivered through the entry plate 1212 into the substrate processing region between the plates. The entry plate 1212 and the exit plate 1220 are planar, in embodiments, and each are perpendicular to the major plane of the patterned substrate 1215. A film is deposited on the patterned substrate 1215 from the aerosol droplets. Unreacted precursor or other process effluents may be pumped out through the exit plate 1220 according embodiments. The process effluents may be pumped out through the vacuum pump 1222. Substrate temperatures, process pressures, droplet sizes and process benefits were presented previously.

In all embodiments described herein, the precursor may be supplied at a flow rate of between 5 mgm (milligrams per minute) and 500 mgm, between 10 mgm and 300 mgm or between 25 mgm and 200 mgm. Two or more low vapor pressure condensed matter precursor may be used in which case each one may have a flow rate between the ranges given above. Film growth rates using the aerosol droplet generation methods and hardware described herein may exceed 300 Å/min, may exceed 500 Å/min or may exceed 1,000 Å/min, in embodiments.

Figure 6:
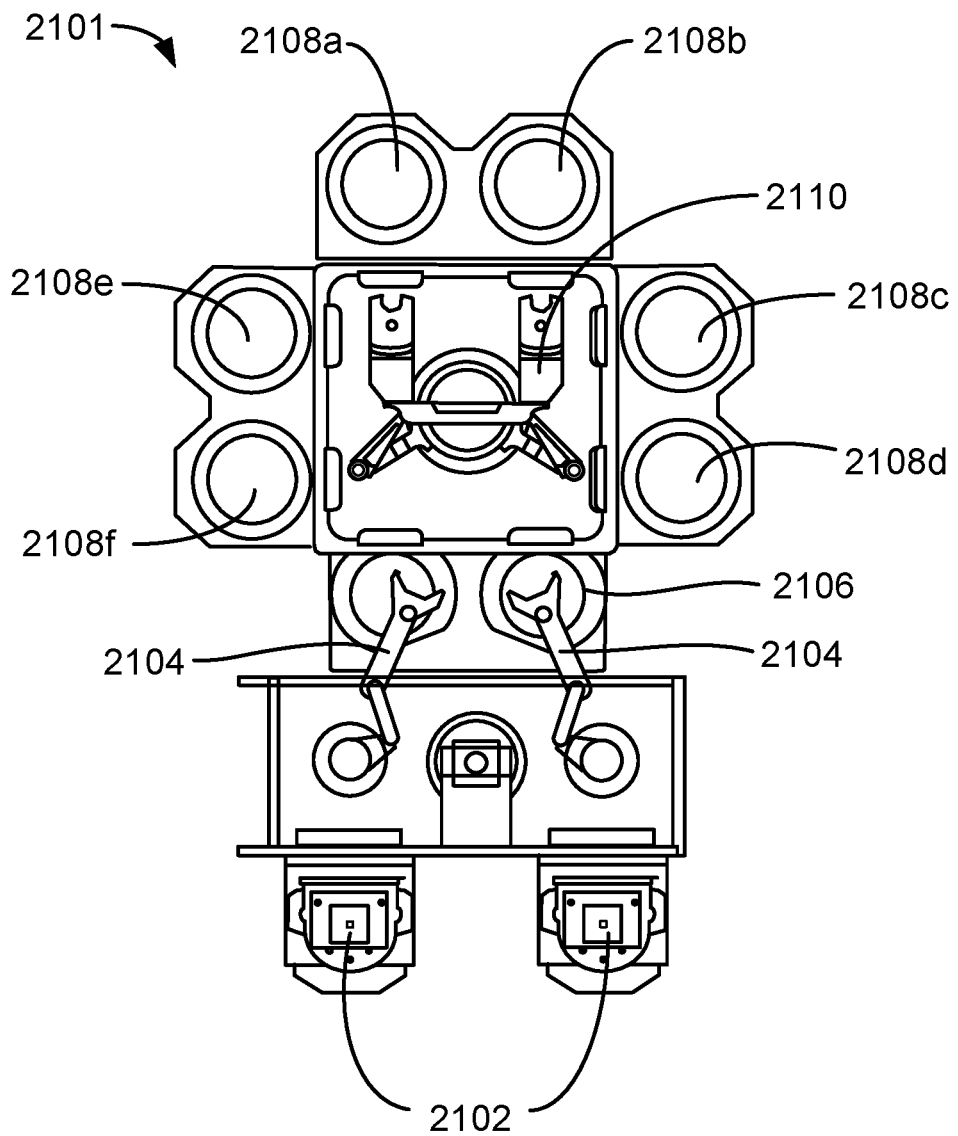
FIG. 6 shows a top view of an exemplary substrate processing system according to embodiments.

Embodiments of the substrate processing chambers may be incorporated into larger fabrication systems for producing integrated circuit chips. FIG. 6 shows one such substrate processing system (mainframe) 2101 of deposition, etching, baking, and curing chambers in embodiments. In the figure, a pair of front opening unified pods (load lock chambers 2102) supply substrates of a variety of sizes that are received by robotic arms 2104 and placed into a low pressure holding area 2106 before being placed into one of the substrate processing chambers 2108*a-f*. A second robotic arm 2110 may be used to transport the substrate wafers from the holding area 2106 to the substrate processing chambers 2108*a-f* and back. Each substrate processing chamber 2108*a-f*, can be outfitted to perform a number of substrate processing operations including the dielectric deposition processes described herein in addition to cyclical layer deposition (CLD), atomic layer deposition (ALD), chemical vapor deposition (CVD), physical vapor deposition (PVD), etch, atomic layer etching, pre-clean, degas, orientation, and other substrate processes.

As used herein "patterned substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "metal" of the patterned substrate is predominantly a metal element but may include minority concentrations of other elemental constituents such as nitrogen, oxygen, hydrogen, silicon and carbon. Exposed "metal" may consist of or consist essentially of a metal element. A metal may comprise or consist of a "metal element" which forms a conducting material in a solid consisting only of that metal element. The conducting material consisting only of the one metal element (or the metal in relatively pure form) may have a conductivity less than 10–5 Ω-m at 20° C. in embodiments. Exposed "metal nitride" of the patterned substrate is predominantly nitrogen and a metal element but may include minority concentrations of other elemental constituents such as oxygen, hydrogen, silicon and carbon. Exposed "metal nitride" may consist of or consist essentially of nitrogen and a metal element.

Exposed "silicon" or "polysilicon" of the patterned substrate is predominantly Si but may include minority concentrations of other elemental constituents such as nitrogen, oxygen, hydrogen and carbon. Exposed "silicon" or "polysilicon" may consist of or consist essentially of silicon. Exposed "silicon nitride" of the patterned substrate is predominantly silicon and nitrogen but may include minority concentrations of other elemental constituents such as oxygen, hydrogen and carbon. "Exposed silicon nitride" may consist essentially of or consist of silicon and nitrogen. Exposed "silicon oxide" of the patterned substrate is predominantly $SiO_2$ but may include minority concentrations of other elemental constituents (e.g. nitrogen, hydrogen, carbon). In some embodiments, silicon oxide regions formed using the methods disclosed herein consist essentially of silicon and oxygen.

The carrier gases described herein may be inert gases. The phrase "inert gas" refers to any gas which does not form chemical bonds when being incorporated into a layer. Exemplary inert gases include noble gases but may include other gases so long as no chemical bonds are formed when (typically) trace amounts are trapped in a layer.

A gap is an etched geometry having any horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. A "via" is a short gap with horizontal aspect ratio, as viewed from above, near unity. A via may appear circular, slightly oval, polygonal or slightly rectangular. A via may or may not be filled with metal to form a vertical electrical connection.

Having disclosed several embodiments, it will be recognized by those of skill in the art that various modifications, alternative constructions, and equivalents may be used without departing from the spirit of the disclosed embodiments. Additionally, a number of well known processes and elements have not been described to avoid unnecessarily obscuring the disclosed embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the disclosed embodiments, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. A method of forming a dielectric on a patterned substrate, the method comprising:
    placing the patterned substrate into a substrate processing region of a substrate processing chamber, wherein the patterned substrate comprises a high aspect ratio gap;
    dissolving a precursor into a solvent to form a precursor solution within an aerosol generator;
    flowing a carrier gas into the aerosol generator to produce aerosol droplets, wherein the aerosol droplets comprise the solvent and the precursor;
    flowing the aerosol droplets into the substrate processing region;
    adsorbing the aerosol droplets onto the patterned substrate to form adsorbed droplets outside the high aspect ratio gap;
    flowing the adsorbed droplets into the high aspect ratio gap;
    evaporating the solvent; and
    filling the high aspect ratio gap with the dielectric, wherein the dielectric is formed from the precursor by a chemical reaction.

2. The method of claim 1 wherein a temperature of the patterned substrate is below a boiling point of the solvent during flowing the adsorbed droplets into the high aspect ratio gap.

3. The method of claim 1 wherein the dielectric is one of silicon oxide, aluminum oxide, silicon nitride, hafnium oxide, zirconium oxide, tantalum oxide, titanium oxide or titanium-doped silicon oxide.

4. The method of claim 1 wherein an aspect ratio of the high aspect ratio gap is greater than 10:1 height:width measured near a center between a bottom of the high aspect ratio gap and a top of the high aspect ratio gap.

5. The method of claim 1 wherein a width of the high aspect ratio gap is less than 10 nm.

6. The method of claim 1 wherein the dielectric fills the high aspect ratio gap without voids.

7. A method of forming a dielectric layer on a patterned substrate, the method comprising:
    placing the patterned substrate into a substrate processing region of a substrate processing chamber, wherein the patterned substrate comprises a high aspect ratio trench;
    forming a liquid solution by combining a deposition precursor and a solvent;
    placing the liquid solution into an aerosol generator;
    applying ultrasonic or higher frequencies to a piezoelectric transducer submerged in the liquid solution;
    forming aerosol droplets in the aerosol generator from the liquid solution;
    flowing the aerosol droplets into the substrate processing region;
    forming an adsorbed liquid on the patterned substrate by depositing the aerosol droplets on the patterned substrate, wherein the adsorbed liquid comprises the deposition precursor and the solvent;
    flowing the adsorbed liquid along a surface of the patterned substrate into the high aspect ratio trench;
    filling the high aspect ratio trench with the adsorbed liquid beginning at a bottom of the high aspect ratio trench and finishing at an opening of the high aspect ratio trench;
    evaporating the solvent; and
    forming the dielectric layer on the patterned substrate from the deposition precursor, wherein the dielectric layer fills the high aspect ratio trench.

8. The method of claim 7 wherein an aspect ratio of the high aspect ratio trench is greater than 10:1 height:width measured near a center between the bottom of the high aspect ratio trench and the opening of the high aspect ratio trench.

9. The method of claim 7 wherein a width of the high aspect ratio trench is less than 10 nm.

10. The method of claim 7 wherein the dielectric layer fills the high aspect ratio trench without voids.

* * * * *